United States Patent
Lee

(10) Patent No.: US 9,633,910 B2
(45) Date of Patent: Apr. 25, 2017

(54) BACKSIDE CONTACTS FOR INTEGRATED CIRCUIT DEVICES

(71) Applicant: Taiwan Semiconductor Manufacturing Co., Ltd., Hsin-Chu (TW)

(72) Inventor: Jam-Wem Lee, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 14/968,124

(22) Filed: Dec. 14, 2015

(65) Prior Publication Data

US 2016/0099182 A1 Apr. 7, 2016

Related U.S. Application Data

(62) Division of application No. 14/021,881, filed on Sep. 9, 2013, now Pat. No. 9,214,398.

(51) Int. Cl.
| | |
|---|---|
| *H01L 21/44* | (2006.01) |
| *H01L 21/48* | (2006.01) |
| *H01L 21/50* | (2006.01) |
| *H01L 21/8238* | (2006.01) |
| *H01L 21/265* | (2006.01) |
| *H01L 21/768* | (2006.01) |
| *H01L 23/00* | (2006.01) |
| *H01L 25/00* | (2006.01) |

(52) U.S. Cl.
CPC ......... *H01L 21/823871* (2013.01); *H01L 21/26506* (2013.01); *H01L 21/76802* (2013.01); *H01L 21/76879* (2013.01); *H01L 21/76898* (2013.01); *H01L 21/823814* (2013.01); *H01L 21/823892* (2013.01); *H01L 24/11* (2013.01); *H01L 24/27* (2013.01); *H01L 24/82* (2013.01); *H01L 25/50* (2013.01); *H01L 2224/16146* (2013.01); *H01L 2224/32146* (2013.01); *H01L 2225/06544* (2013.01)

(58) Field of Classification Search
CPC ..... H01L 21/823892; H01L 21/823814; H01L 21/823871; H01L 21/26506; H01L 21/76802; H01L 21/76879
USPC .......................................... 438/109, 199, 233
See application file for complete search history.

(56) References Cited

U.S. PATENT DOCUMENTS

| | | | |
|---|---|---|---|
| 6,864,156 B1 | 3/2005 | Conn | |
| 2008/0242014 A1* | 10/2008 | Peidous | ............ H01L 21/76251 438/199 |

* cited by examiner

*Primary Examiner* — Thien F Tran
(74) *Attorney, Agent, or Firm* — Slater Matsil, LLP

(57) ABSTRACT

A chip includes a semiconductor substrate, a well region in the semiconductor substrate, and a transistor formed at a front side of the semiconductor substrate. A source/drain region of the transistor is disposed in the well region. A well pickup region is disposed in the well region, wherein the well pickup region is at a back side of the semiconductor substrate. A through-via penetrates through the semiconductor substrate, wherein the through-via electrically intercouples the well pickup region and the source/drain region.

20 Claims, 8 Drawing Sheets

BACKSIDE CONTACTS FOR INTEGRATED CIRCUIT DEVICES

PRIORITY CLAIM AND CROSS-REFERENCE

This application is a divisional of U.S. patent application Ser. No. 14/021,881, entitled "Backside Contacts for Integrated Circuit Devices," filed on Sep. 9, 2013, which application is incorporated herein by reference.

BACKGROUND

In the formation of integrated circuits, transistors are often formed in well regions, which include p-well regions and n-well regions. The well regions are typically applied with bias voltages, or electrically grounded. In order to apply the bias voltages, pickup regions and the respective contact plugs are formed to connect to the well region. The pickup regions are heavily doped semiconductor regions at the surfaces of the well regions. A p-well region has a heavily doped p-type pickup region, and an n-well region has a heavily doped n-type pickup region.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A package with a chip that has backside body contacts and the method of forming the same are provided in accordance with various exemplary embodiments. The intermediate stages of forming the package are illustrated. The variations of the embodiments are discussed. Throughout the various views and illustrative embodiments, like reference numbers are used to designate like elements.

Figure 1:
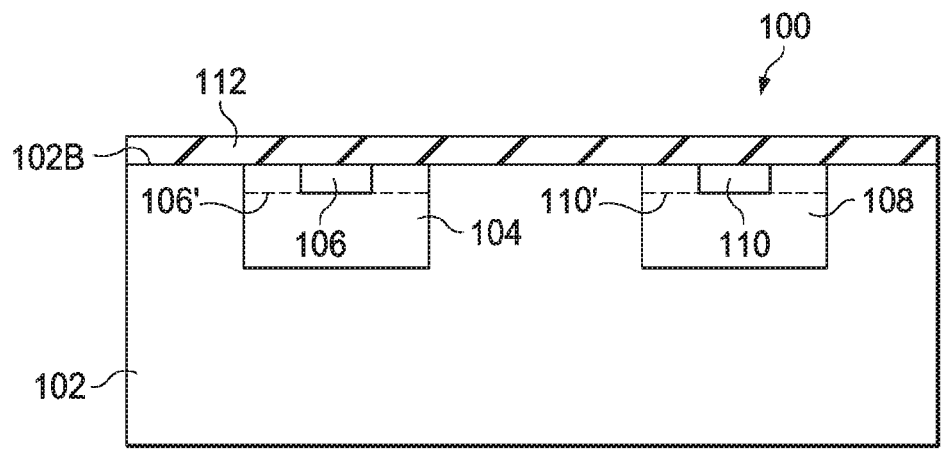
FIGS. 1 through 6 are cross-sectional views of intermediate stages in the manufacturing of a first chip/wafer in accordance with some exemplary embodiments, wherein the first chip includes backside well pickup regions connected to well regions.
Figure 9:
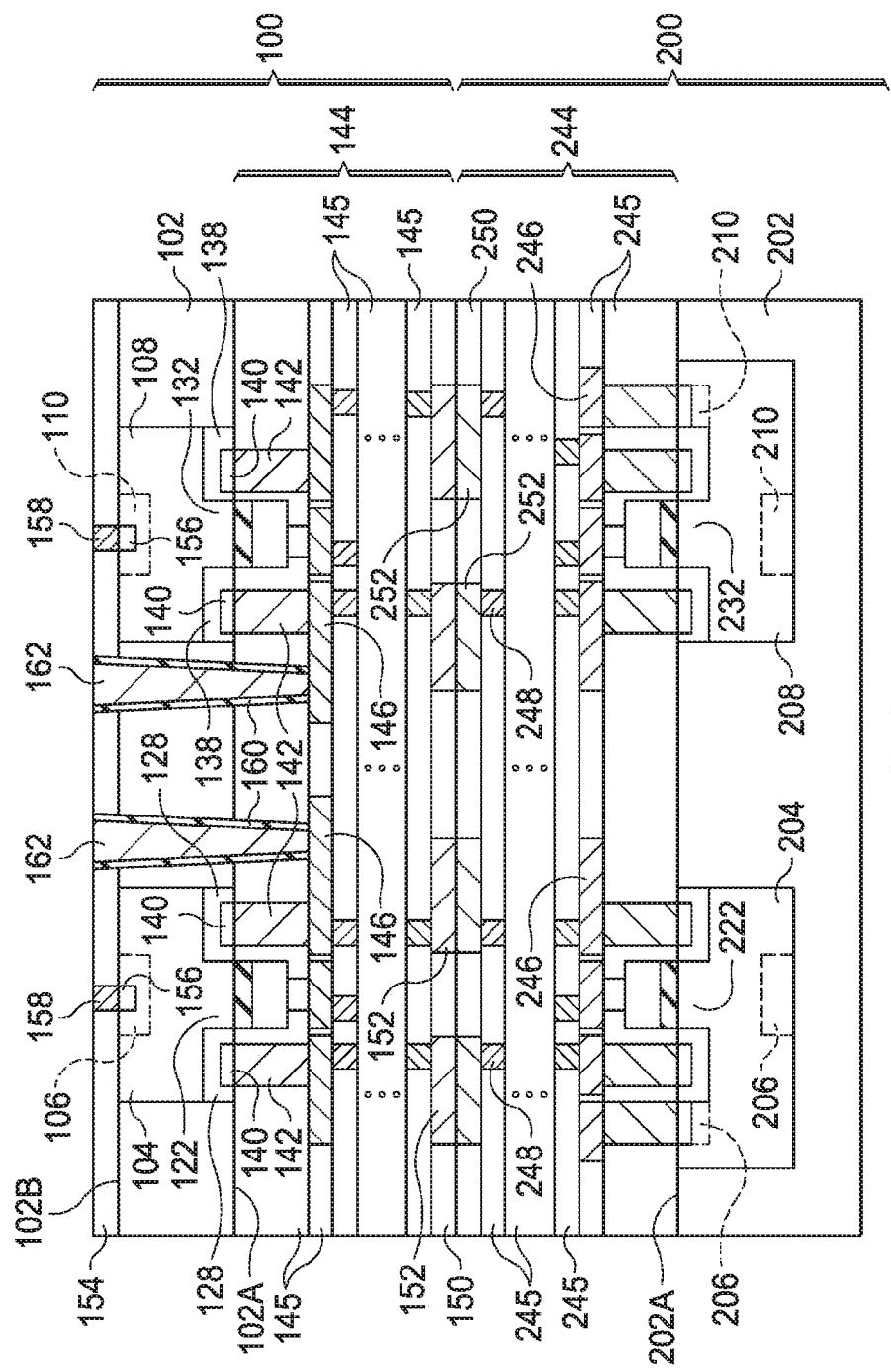
Figure 10:
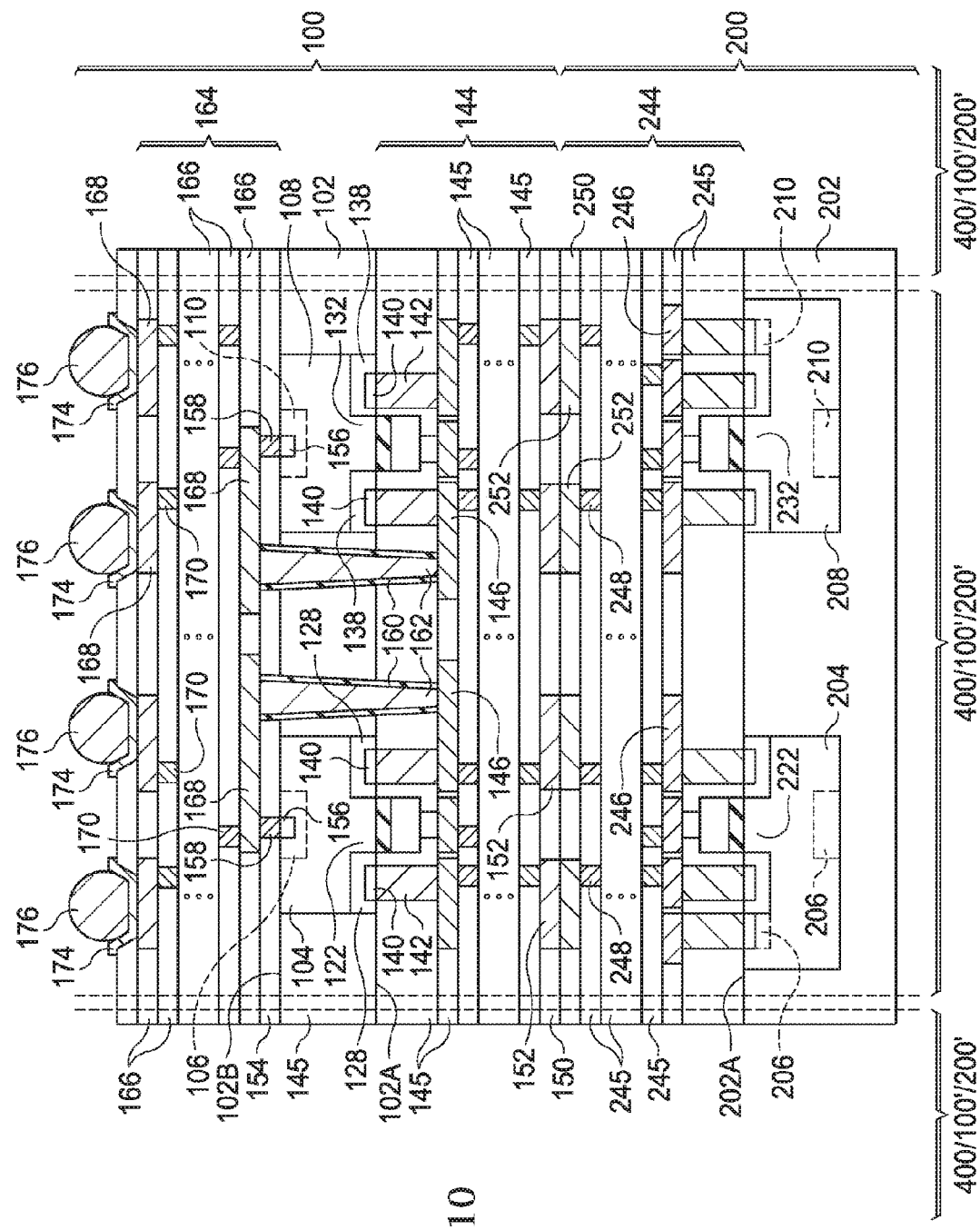
Figure 11:
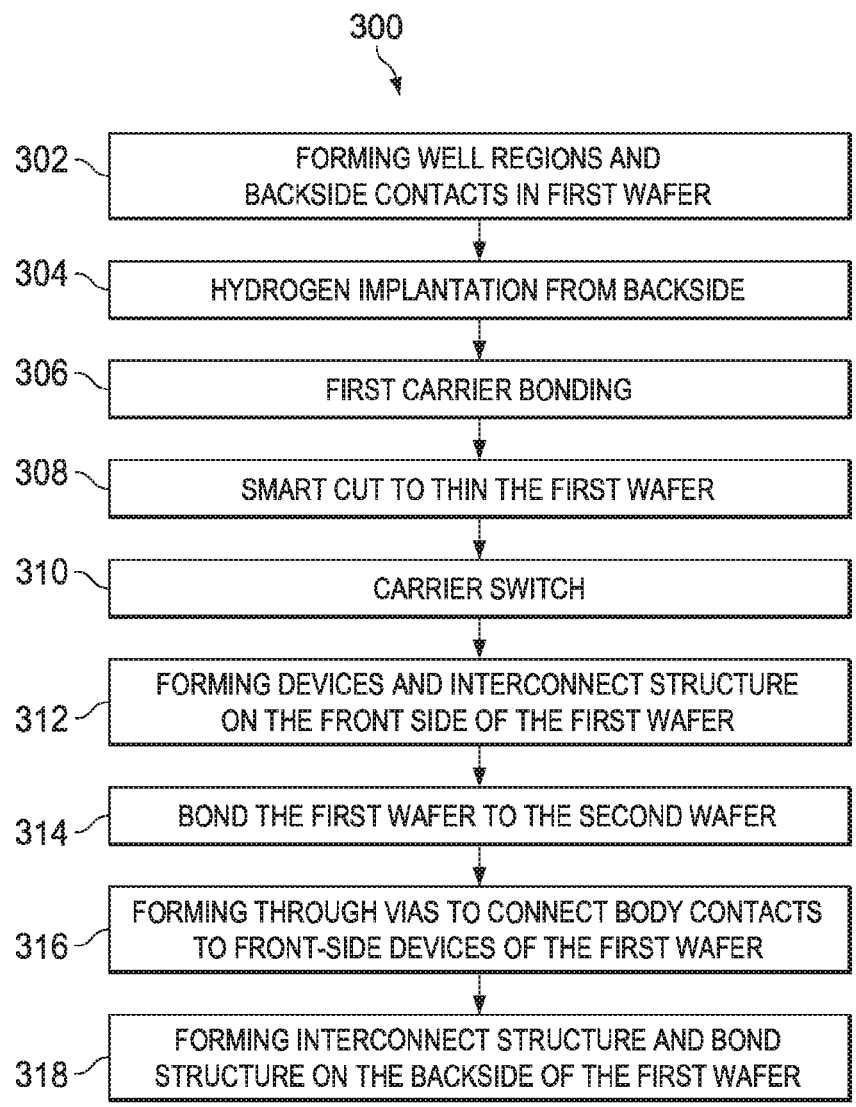
FIG. 11 illustrates a flow chart for forming a package in accordance with some embodiments.

FIG. 11 illustrates flow chart 300 for forming a package in accordance with some embodiments, wherein the process steps illustrated in FIGS. 1 through 10 are discussed referring to the steps shown in FIG. 11. FIGS. 1 through 6 are cross-sectional views of intermediate stages in the manufacturing of parts of a first chip in accordance with some exemplary embodiments. Referring to FIG. 1, wafer 100 is provided. Wafer 100 includes semiconductor substrate 102, which may be a silicon substrate in some embodiments. In alternative embodiments, semiconductor substrate 102 is formed of other semiconductor materials such as silicon germanium, silicon carbon, III-V compound semiconductors, or the like. Semiconductor substrate 102 is a bulk substrate that is formed of a homogeneous material, which means that the entire semiconductor substrate 102 is formed of a same semiconductor material such as silicon, silicon germanium, silicon carbon, III-V compound semiconductors, and the like.

P-well region 104 and N-well region 108 are formed in semiconductor substrate 102 (step 302 in FIG. 11). In some embodiments, P-well region 104 and N-well region 108 extend from back surface 102B to an intermediate level of semiconductor substrate 102. In some embodiments, P-well region 104 and N-well region 108 have the respective p-type and n-type impurity concentrations in the range between about $1E14/cm^3$ and $1E17/cm^3$, although higher or lower impurity concentrations may also be used. It is appreciated, however, that the values recited throughout the description are merely examples, and may be changed to different values.

P-well pickup region 106 and N-well pickup region 110 are formed over P-well region 104 and N-well region 108, respectively (step 302 in FIG. 11), for example, through implanting the surface portions of P-well region 104 and N-well region 108, respectively. P-well pickup region 106 and N-well pickup region 110 are heavily doped regions with the respective p-type and n-type impurity concentrations higher than about $1E19/cm^3$. The impurity concentrations in the heavily doped regions 106 and 110 may also be in the range between about $1E19/cm^3$ and $1E21/cm^3$. In accordance with some embodiments, P-well pickup region 106 and N-well pickup region 110 cover parts, but not all, of the respective P-well region 104 and N-well region 108. In alternative embodiments, an entirety of one of P-well region 104 and N-well region 108 is covered by the respective P-well pickup region 106 and N-well pickup region 110, which means that the edges of P-well pickup region 106 and N-well pickup region 110 extend to the edges of the respective P-well region 104 and N-well region 108. The P-well pickup region 106 and N-well pickup region 110 in these embodiments are marked as 106' and 110', respectively.

In some embodiments, sacrificial layer 112 is formed. Sacrificial layer 112 may be formed before or after the formation of regions 104, 106, 108, and 110, and is formed to reduce the damage caused by the implantations for forming regions 104, 106, 108, and 110. Sacrificial layer 112 may be a silicon oxide layer in some embodiments. The formation of sacrificial layer 112 includes, for example, thermal oxidation or a deposition using Plasma Enhanced Chemical Vapor Deposition (PECVD), Atomic Layer Deposition (ALD), or the like.

Figure 2:
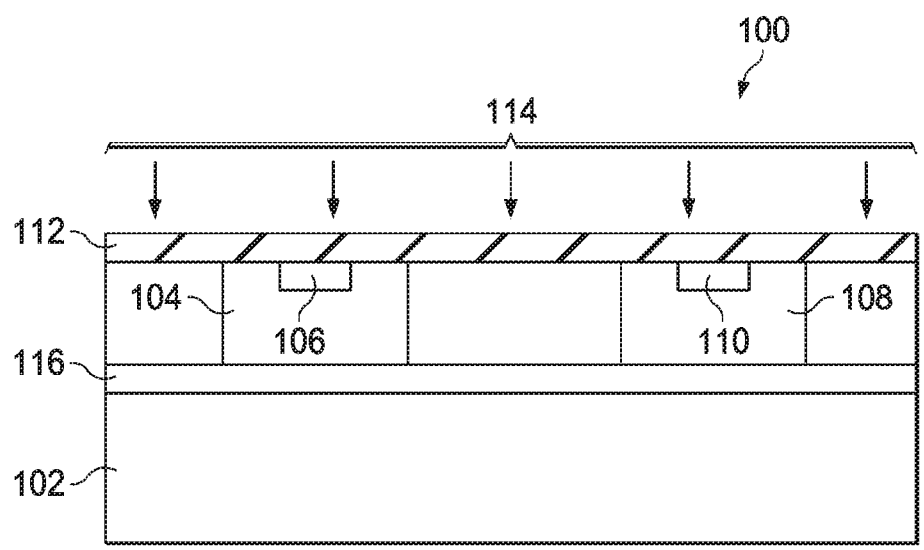

Referring to FIG. 2, hydrogen implantation 114 is performed to implant hydrogen ions into substrate 102 (step 304 in FIG. 11), so that hydrogen-concentrated layer 116 is formed in substrate 102. The implantation is performed from the backside (the side facing up in FIG. 2) of wafer 100 in some embodiments. Hydrogen-concentrated layer 116 may extend into the bottom portions of P-well region 104 and N-well region 108 in some embodiments. In alternative embodiments, the top surface of hydrogen-concentrated layer 116 is either coplanar with or lower than the bottom surfaces of P-well region 104 and N-well region 108. The top surface of hydrogen-concentrated layer 116 may also be lower than the bottom surfaces of P-well pickup region 106 and N-well pickup region 110 in yet alternative embodiments.

Figure 3:
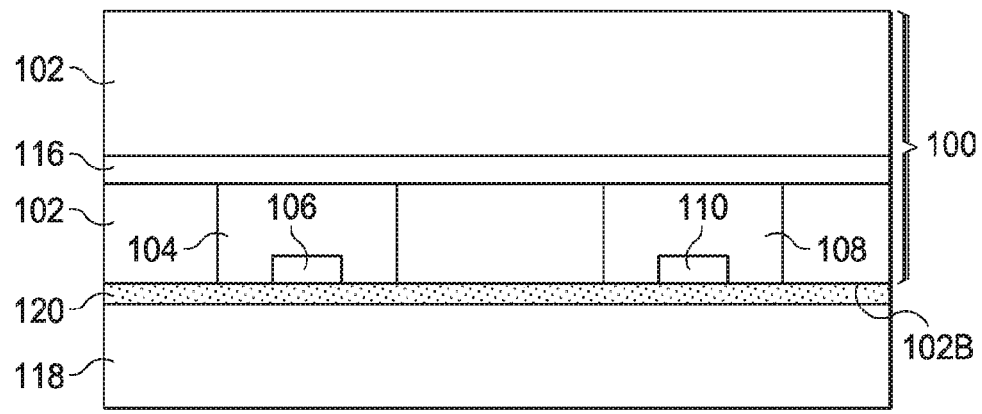
Figure 4:
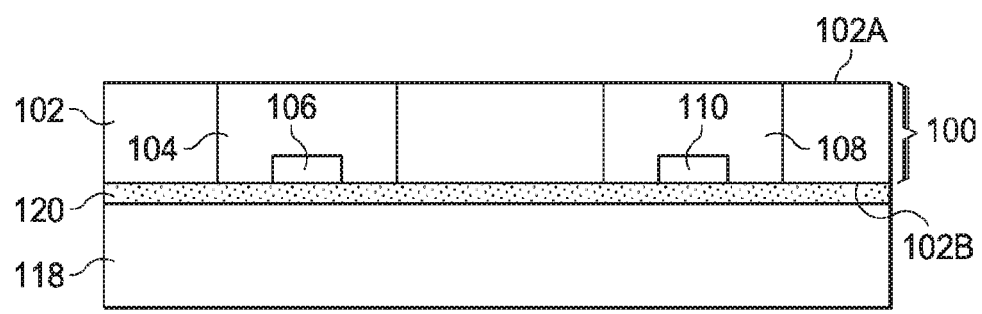

After the hydrogen implantation, sacrificial layer 112 is removed, and wafer 100 is mounted on carrier 118 (step 306 in FIG. 11), as shown in FIG. 3. The back surface 102B of substrate 102 faces toward carrier 118. Carrier 118 may be a glass carrier, a ceramic carrier, or the like. In some embodiments, wafer 100 is mounted on carrier 118 through adhesive 120, which may be an Ultra Violet (UV) glue. Next, as shown in FIG. 4, wafer 100 is cleaved to separate the portion overlying hydrogen-concentrated layer 116 and the portion underlying hydrogen-concentrated layer 116 (step 308 in FIG. 11). The respective method is sometimes referred to as a smart cut, which may include annealing wafer 100 at an elevated temperature such as about 350° C. to about 450° C., and/or applying sideway mechanical forces in the directions parallel to the top surface of wafer 100. After the smart cut, a planarization such as a Chemical Mechanical Polish (CMP) is performed to remove remaining hydrogen-concentrated layer 116, and to level front surface 102A of substrate 102. After the planarization, P-well region 104 and N-well region 108 are exposed. As a result, P-well region 104 and N-well region 108 penetrate through the remaining substrate 102.

Figure 5:
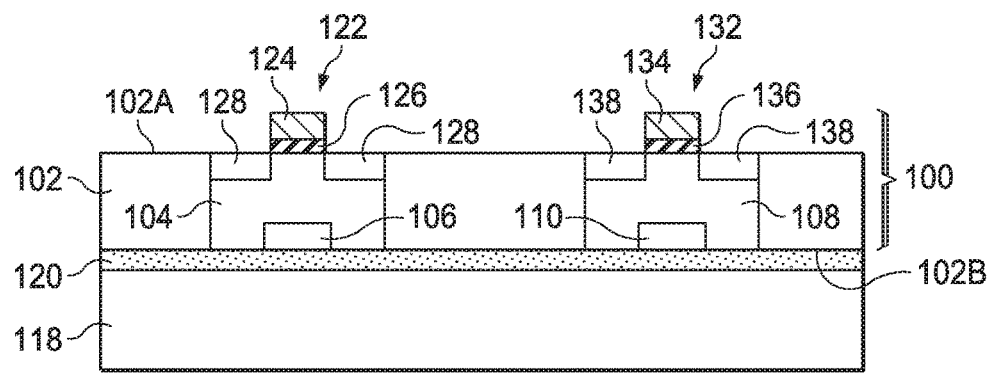

Next, referring to FIG. 5, integrated circuit devices, which may include transistors, diodes (not shown), resistors (not shown), or the like, are formed. FIG. 5 schematically illustrates the formation of n-type Metal Oxide Semiconductor (nMOS) transistor 122 and p-type MOS (pMOS) transistor 132 (step 312 in FIG. 11) in P-well region 104 and N-well region 108, respectively. In some embodiments, nMOS transistor 122 includes gate electrode 124, gate dielectric 126, and source and drain regions 128, which are heavily doped n-type regions. PMOS transistor 132 includes gate electrode 134, gate dielectric 136, and source and drain regions 138, which are heavily doped p-type regions. Source/drain regions 128 and 138 may have n-type and p-type impurity concentrations in the range between about $1E19/cm^3$ and $1E21/cm^3$. Throughout the description, the side 102A of substrate 102, at which side the integrated circuit devices 122/132 are formed, is referred to as the front surface of substrate 102 and the front surface of wafer 100, and the opposite surface 102B is referred to as a back surface of substrate 102 and the back surface of wafer 100.

Figure 6:
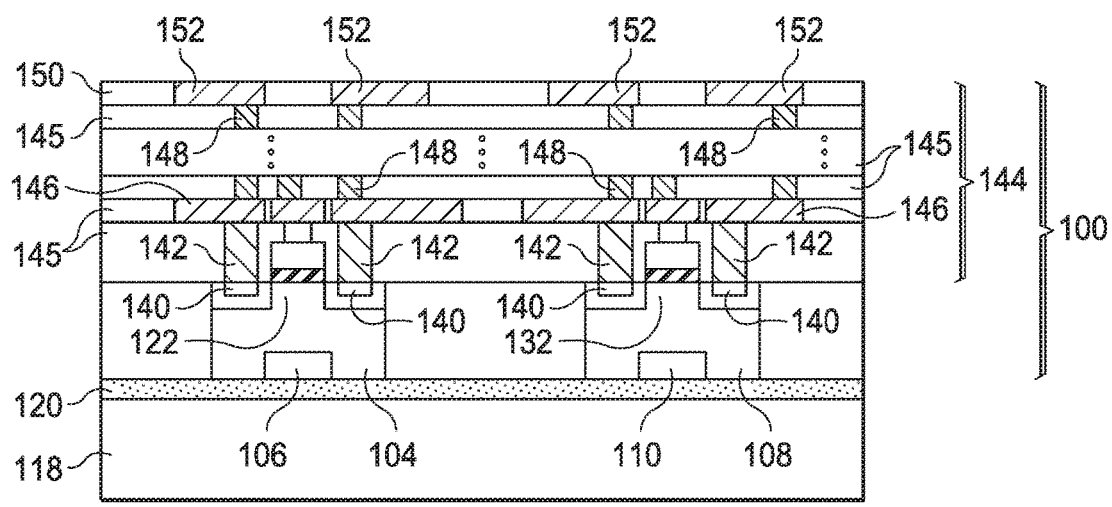

Referring to FIG. 6, source/drain silicide regions 140 are formed at the top surfaces of source/drain regions 128 and 138, and source/drain contact plugs 142 are formed over and in contact with source/drain silicide regions 140. Furthermore, interconnect structure 144 is formed (step 312 in FIG. 11). Interconnect structure 144 includes dielectric layers 145, and metal lines 146 and vias 148 formed in dielectric layers 145. Dielectric layers 145 may include an Inter-Layer Dielectric (ILD), Inter-Metal Dielectric (IMD) layers, passivation layers, and the like. Front surface 102A of substrate 102 is thus in contact with the overlying dielectric layer 145, which may be a contact etch stop layer or the ILD, for example. The ILD layer and the IMD layers may be low-k dielectric layers in some embodiments, which have dielectric constants (k values) lower than about 3.5, lower than about 3.0, or lower than about 2.5. Dielectric layers 145 may also include non-low-k dielectric materials having dielectric constants (k values) equal to or greater than 3.8. Metal lines 146 and vias 148 may include copper, aluminum, nickel, tungsten, or alloys thereof. Metal lines 146 and vias 148 interconnect the integrated circuit devices such as transistors 122 and 132, and may electrically couple the integrated circuit devices to the overlying metal features 152.

In some embodiments, interconnect structure 144 includes surface dielectric layer 150, which is formed at the surface of wafer 100. Surface dielectric layer 150 may be a silicon-containing dielectric layer, which may comprise silicon oxide ($SiO_2$), silicon oxynitride (SiON), silicon nitride (SiN), or the like. Metal pads 152 are formed in surface dielectric layer 150, and may be electrically coupled to devices 122/132 through metal lines 146 and vias 148. Metal pads 152 may also be formed of copper, aluminum, or alloys thereof. The top surface of surface dielectric layer 150 and the top surfaces of metal pads 152 may be substantially coplanar with each other.

Figure 7:
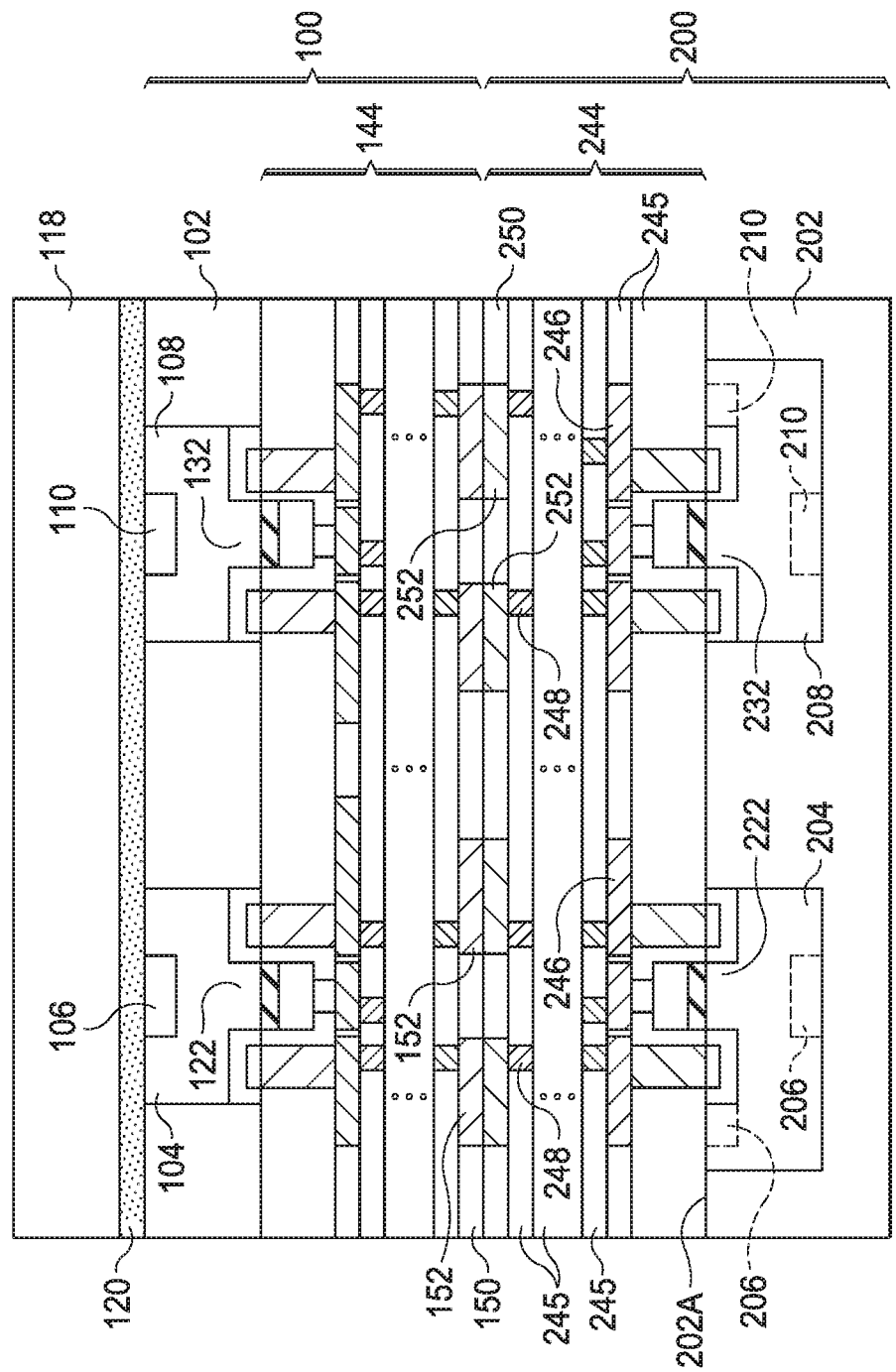
FIGS. 7 through 10 are cross-sectional views of intermediate stages in the bonding of the first chip/wafer to a second chip/wafer and the continued formation of the first chip/wafer in accordance with some exemplary embodiments.

FIG. 7 illustrates the bonding of wafer 100 to wafer 200 (step 314 in FIG. 11). Wafer 200 may be selected from a device wafer, an interposer wafer, and the like. In the illustrated FIG. 7, wafer 200 includes substrate 202, P-well region 204, N-well region 208, P-well pickup region 206, N-well pickup region 210, active devices 222/232, dielectric layers 245, metal lines 246 and vias 248 in dielectric layers 245, surface dielectric layer 250, and metal pads 252. Wafer 200 may have a structure similar to what is described for wafer 100, and the details are not repeated herein. The materials of the features in wafer 200 may be found referring to the like features in wafer 100. The features in wafer 200 are marked with reference numerals starting with number "2," which features correspond to the like features in wafer 100 and having similar reference numerals starting with number "1."

In some embodiments, P-well pickup region 206 and N-well pickup region 210 are formed at the front surface 202A of substrate 202. In alternative embodiments, P-well pickup region 206 and N-well pickup region 210 are formed at the bottom surfaces of well pickup region 206 and N-well pickup region 210, respectively. In which embodiments, further process steps may be performed to electrically couple to P-well pickup region 206 and N-well pickup region 210 from the backside (the bottom side in FIG. 7) of wafer 200.

Figure 8:
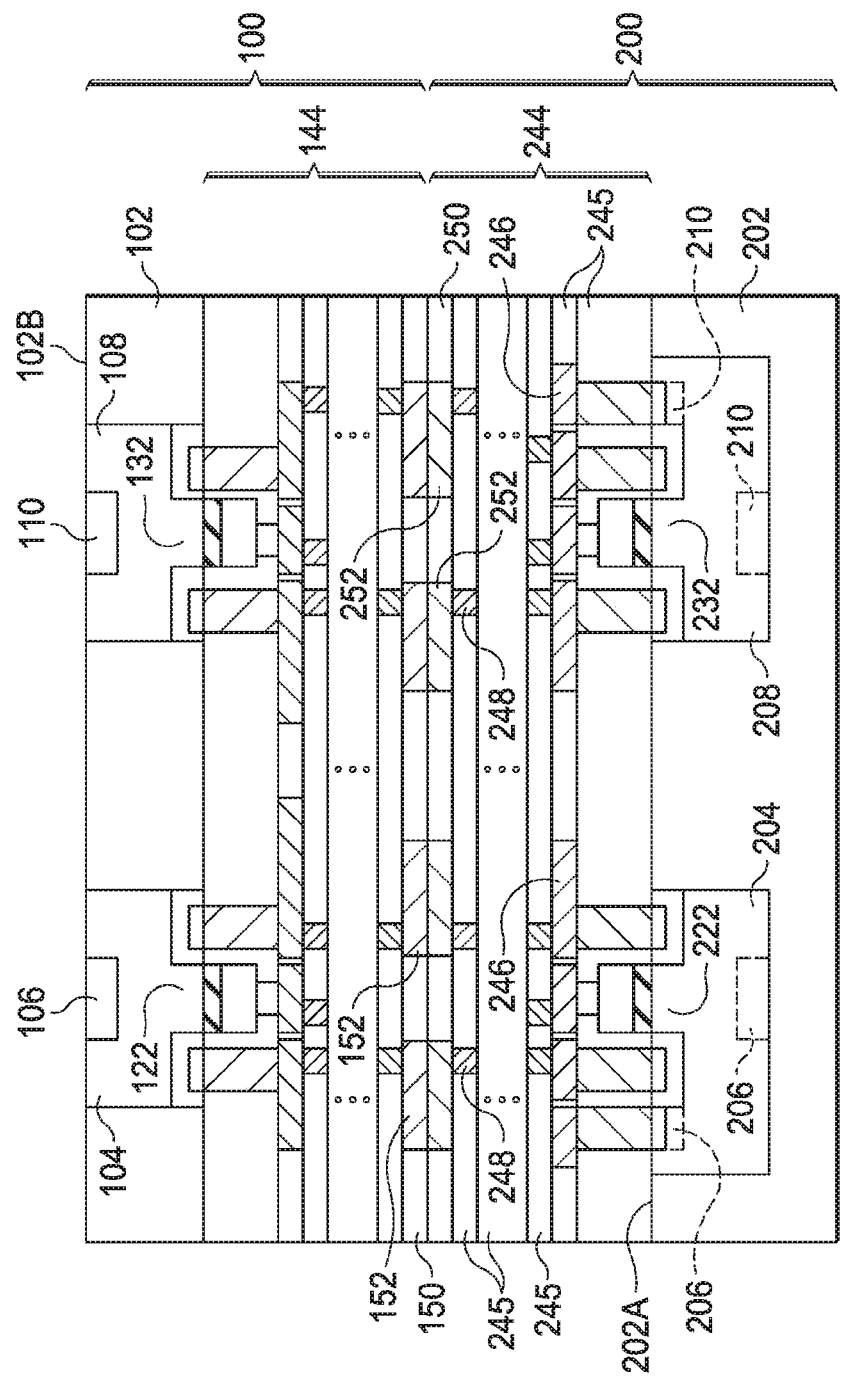

Carrier 118 and glue 120 are removed, and the respective structure is shown in FIG. 8. Back surface 102B of substrate 102 is exposed. P-well region 104, N-well region 108, P-well pickup region 106, and N-well pickup region 110 are also exposed. Next, as shown in FIG. 9, dielectric layer 154 is formed over and contacting the back surface 102B of substrate 102. Body silicide regions 156 may be formed at the top surfaces of P-well pickup region 106 and N-well pickup region 110. Body contact plugs 158 are formed in dielectric layer 154 to connect to body silicide regions 156. Throughout the description, each of well pickup region 106 and N-well pickup region 110 is referred to as a backside contact structure. The backside contact structure may also include the respective overlying silicide regions 156 and contact plugs 158.

In addition, Inter-Layer Vias (ILV) 162 are formed to electrically connect to metal line/pads 146 on the front side of substrate 102 (step 316 in FIG. 11). Throughout the description, ILVs 162 are also referred to as through-vias. Isolation layers 160 are formed to encircle ILVs 162, so that ILVs 162 are electrically decoupled from substrate 102. The formation process may include etching dielectric layer 154, substrate 102, and dielectric layer 145 to form openings, filling an isolation layer in the openings, and removing the bottom portions of the isolation layer in the openings to expose metal lines/pads 146. A metallic material is then filled into the openings, followed by a CMP. The remaining portions of the isolation layer and the metallic material in the openings form isolation layers 160 and ILVs 162, respectively.

FIG. 10 illustrates the formation of interconnect structure 164 on the backside of substrate 102 (step 318 in FIG. 11). Interconnect structure 164 may include dielectric layers 166, and metal lines 168 and vias 170 in dielectric layers 166. Dielectric layers 166 may include low-k dielectric layers, passivation layers, and the like. The low-k dielectric layers may have dielectric constants (k values) lower than about 3.5, lower than about 3.0, or lower than about 2.5. Dielectric layers 166 may also include non-low-k dielectric materials having dielectric constants (k values) equal to or greater than 3.8. Metal lines 168 and vias 170 may include copper, aluminum, nickel, tungsten, or alloys thereof. Through contact plugs 142, ILVs 162, and metal lines 168, the source/drain silicide regions 140 are electrically connected to the respective backside body contacts 106/110/156/158, so that the backside body contacts may have same voltage levels as the respective source and drain regions that are in the same well regions.

In some embodiments, Under-Bump Metallurgies (UBMs) 174 are formed, and electrical connectors 176 are formed on UBMs 174. Electrical connectors 176 may include solder balls, copper bumps, or the like. Electrical connectors 176 may be electrically connected to the integrated circuit devices (such as 122/132) in wafer 100 and the integrated circuit devices 222/232 in wafer 200, for example, through ILVs 162.

After the formation of the bonded wafers 100 and 200, a die-saw may be performed, and wafer 100 and 200 are sawed into a plurality of packages 400, each including one of chips 100' in wafer 100, and one of chips 200' in wafer 200. Packages 400 may then be bonded to other package components such as interposers, package substrates, printed circuit boards, or the like.

The embodiments of the present disclosure have several advantageous features. Since the body contacts of the well regions are formed on the backside of the substrates, they can overlap the respective devices such as transistors. Accordingly, the body contacts do not take extra chip area, and hence the chip area usage is improved. Furthermore, with the backside body contacts, the efficiency in the body pickup is improved over that of the front-side body contacts, and hence the efficiency in the Electro-Static Discharge (ESD) performance and the resistance to the latch-up of the respective package is improved.

In accordance with some embodiments, a chip includes a semiconductor substrate, a well region in the semiconductor substrate, and a transistor formed at a front side of the semiconductor substrate. A source/drain region of the transistor is disposed in the well region. A well pickup region is disposed in the well region, wherein the well pickup region is at a back side of the semiconductor substrate. A through-via penetrates through the semiconductor substrate, wherein the through-via electrically inter-couples the well pickup region and the source/drain region.

In accordance with other embodiments, an integrated circuit structure includes a semiconductor substrate, a well region extending from a front surface of the semiconductor substrate to a back surface of the semiconductor substrate, and a well pickup region in the well region and extending from the back surface of the semiconductor substrate into the semiconductor substrate. The well pickup region and the well region are of a first conductivity type. A first silicide region contacts a surface of the well pickup region. A heavily doped semiconductor region is in the well region and extends from the front surface of the semiconductor substrate into the semiconductor substrate. The heavily doped semiconductor region is of a second conductivity type opposite to the first conductivity type. A second silicide region contacts a surface of the heavily doped semiconductor region. Metallic features connect the first silicide region to the second silicide region.

In accordance with yet other embodiments, a method includes forming a well region extending from a back surface of a semiconductor substrate into the semiconductor substrate, forming a well pickup region extending from the back surface of the semiconductor substrate into the well region, and forming a transistor at a front surface of the well region. The front surface of the well region is comprised in a front surface of the semiconductor substrate. The step of forming the transistor includes forming a source/drain region at the front surface of the well region, and forming a source/drain silicide region contacting the source/drain region. Metallic features are formed to electrically inter-couple the well pickup region and the source/drain silicide region.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a well region extending from a back surface of a semiconductor substrate into the semiconductor substrate;
   forming a well pickup region extending from the back surface of the semiconductor substrate into the well region;
   forming a transistor comprising:
      forming a source/drain region in the well region and extending to a front surface of the semiconductor substrate; and
      forming a source/drain silicide region contacting the source/drain region;
   performing an etching step to form an opening penetrating through the semiconductor substrate;
   forming conductive features electrically inter-coupling the well pickup region and the source/drain silicide region, wherein a portion of the conductive features extends into the opening; and
   after the transistor is formed:
      forming a first interconnect structure on a front side of the semiconductor substrate;
      bonding a wafer to the first interconnect structure;
      forming a through-via, wherein the through-via is a part of the conductive features, wherein the through-via penetrates through the semiconductor substrate, a first dielectric layer, and a second dielectric layer, and wherein the first dielectric layer and the second dielectric layer are in contact with the front surface and the back surface, respectively, of the semiconductor substrate; and forming a second interconnect structure on a backside of the semiconductor substrate.

2. The method of claim 1 further comprising:
before the transistor is formed, cleaving and planarizing the semiconductor substrate to expose the front surface of the semiconductor substrate.

3. The method of claim 2, wherein the cleaving the semiconductor substrate comprises:
implanting hydrogen ions from a backside of the semiconductor substrate to form a hydrogen-concentrated layer in the semiconductor substrate; and
performing the cleaving along the hydrogen-concentrated layer to separate the semiconductor substrate into a first portion and a second portion, wherein the well region is located in the first portion.

4. The method of claim 1 further comprising forming solder regions on a backside of the semiconductor substrate.

5. The method of claim 1, wherein the well region and the well pickup region are of a conductivity type opposite to a conductivity type of the source/drain region.

6. The method of claim 1, wherein the semiconductor substrate is in a first chip, and the method further comprises:
bonding a second chip to a front side the first chip, wherein the second chip is a part of the wafer; and
forming solder balls at a backside of the first chip.

7. The method of claim 1, wherein the wafer is a device-comprising wafer comprising transistors therein.

8. A method comprising:
forming a sacrificial layer on a backside of a semiconductor substrate, wherein the sacrificial layer is in contact with a well region in the semiconductor substrate;
implanting hydrogen ions from the backside of the semiconductor substrate, wherein the hydrogen ions penetrate through the sacrificial layer to form a hydrogen-concentrated layer in the semiconductor substrate;
removing the sacrificial layer after the hydrogen ions are implanted;
performing a cleaving process along the hydrogen-concentrated layer to separate the semiconductor substrate into a first portion and a second portion;
performing a planarization on the first portion of the semiconductor substrate, wherein after the planarization, the well region extends to a back surface of the first portion of the semiconductor substrate; and
forming a transistor, with a source/drain region of the transistor having a portion in the well region.

9. The method of claim 8 further comprising forming an electrical conductive path electrically inter-coupling a well pickup region of the well region to the source/drain region, wherein the well region extends from a front surface of the semiconductor substrate into the semiconductor substrate.

10. The method of claim 9 further comprising:
forming an interconnect structure comprising forming a plurality of dielectric layers on a front side of the semiconductor substrate;
etching the semiconductor substrate and at least one of the plurality of dielectric layers to form an opening; and
filling the opening with a conductive material, wherein the conductive material forms a portion of the electrical conductive path.

11. The method of claim 10, wherein the opening further penetrates through an additional dielectric layer, wherein the additional dielectric layer is on the backside of the semiconductor substrate.

12. The method of claim 10 further comprising filling an isolation layer into the opening, wherein the isolation layer encircles the conductive material.

13. The method of claim 8 further comprising adhering the well region to a carrier through an adhesive, with the adhesive contacting the well region.

14. A method comprising:
forming a wafer comprising:
a semiconductor substrate; and
a well region extending from a front surface to a back surface of the semiconductor substrate;
forming a transistor comprising forming a source/drain region extending into the well region;
forming a first dielectric layer contacting the front surface of the semiconductor substrate;
forming a second dielectric layer contacting the back surface of the semiconductor substrate;
etching the first dielectric layer and the second dielectric layer to form an opening, wherein the opening further penetrates through the semiconductor substrate; and
filling the opening with a conductive material to form an Inter-Layer Via (ILV), wherein the ILV electrically couples a pickup region of the well region to the source/drain region.

15. The method of claim 14 further comprising:
forming a contact plug in the first dielectric layer, wherein the contact plug electrically couples the source/drain region to the ILV; and
forming a via in the second dielectric layer, wherein the via electrically couples the pickup region to the ILV.

16. The method of claim 14, wherein the forming the wafer comprises:
implanting hydrogen ions to form a hydrogen-concentrated layer, wherein the hydrogen ions penetrate through the well region; and
performing a cleaving process along the hydrogen-concentrated layer to separate the semiconductor substrate into a first portion comprising the well region and a second portion; and
performing a planarization on the first portion of the semiconductor substrate, wherein after the planarization, the well region is exposed.

17. The method of claim 16, wherein at a time the implanting is performed, the well region extends to the back surface of the semiconductor substrate.

18. The method of claim 14 further comprising forming solder regions on a backside of the semiconductor substrate.

19. The method of claim 14, wherein the pickup region extends from the back surface of the semiconductor substrate into the semiconductor substrate.

20. The method of claim 14 further comprising forming an isolation layer encircling the ILV, wherein the isolation layer separates the ILV from the semiconductor substrate.

* * * * *